(12) United States Patent
Hui et al.

(10) Patent No.: US 6,694,463 B2
(45) Date of Patent: Feb. 17, 2004

(54) INPUT/OUTPUT CONTINUITY TEST MODE CIRCUIT

(75) Inventors: Edward S. Hui, Cupertino, CA (US); Dirk R. Franklin, Los Gatos, CA (US)

(73) Assignee: Atmel Corporation, San Jose, CA (US)

( * ) Notice: Subject to any disclaimer, the term of this patent is extended or adjusted under 35 U.S.C. 154(b) by 449 days.

(21) Appl. No.: 09/764,169

(22) Filed: Jan. 16, 2001

(65) Prior Publication Data

US 2002/0095631 A1 Jul. 18, 2002

(51) Int. Cl.$^7$ ............................................... G01R 31/28
(52) U.S. Cl. ...................................................... 714/724
(58) Field of Search ................................ 714/724, 733, 714/734, 30; 365/201

(56) References Cited

U.S. PATENT DOCUMENTS

| | | | | |
|---|---|---|---|---|
| 4,825,414 A | | 4/1989 | Kawata ........................ 365/189 |
| 5,502,677 A | * | 3/1996 | Takahashi .................... 365/201 |
| 5,561,614 A | * | 10/1996 | Revilla et al. ............... 702/120 |
| 5,589,777 A | * | 12/1996 | Davis et al. ................. 324/537 |
| 5,699,554 A | * | 12/1997 | Vajapey ........................ 716/4 |
| 5,744,967 A | * | 4/1998 | Sorensen ..................... 324/540 |
| 5,852,364 A | * | 12/1998 | Whetsel ........................ 326/16 |
| 5,961,657 A | | 10/1999 | Park et al. ................... 714/718 |
| 5,983,377 A | | 11/1999 | Knotts ......................... 714/726 |
| 6,072,783 A | * | 6/2000 | Riley .......................... 370/294 |
| 6,119,249 A | | 9/2000 | Landry ........................ 714/718 |
| 6,223,312 B1 | * | 4/2001 | Nozuyama ................... 714/724 |
| 6,223,313 B1 | * | 4/2001 | How et al. ................... 714/724 |
| 6,304,987 B1 | * | 10/2001 | Whetsel, Jr. ................. 714/724 |
| 6,493,840 B1 | * | 12/2002 | Shacham et al. ........... 714/724 |
| 6,550,031 B1 | * | 4/2003 | Godfrey et al. ............. 714/726 |

FOREIGN PATENT DOCUMENTS

| | | |
|---|---|---|
| EP | 0 822 354 | 7/1998 |
| JP | 04-159752 | 6/1992 |
| JP | 10-177501 | 6/1998 |

OTHER PUBLICATIONS

IEEE Standard Board, 1149.1–1990 Abstract, titled "IEEE Standard Test Access Port and Boundary–Scan Architecture" XP–002197438, approved Feb. 15, 1990 (entire document).

* cited by examiner

*Primary Examiner*—Albert Decady
*Assistant Examiner*—Matthew C. Dooley
(74) *Attorney, Agent, or Firm*—Thomas Schneck

(57) ABSTRACT

A continuity test mode circuit in an integrated circuit device having a means for switching between a continuity test mode and a normal operating mode. The test mode is characterized by one or more input pins being in direct electrical connection with one or more output pins to enable the pins and the chip packaging and chip socket and circuit board to be tested for continuity. In normal operating mode, the operation of the chip is not affected by the test mode circuitry. The continuity test mode circuit allows for testing of device-socket and/or device-board continuity in order to ensure accurate testing and programming of the device.

21 Claims, 3 Drawing Sheets

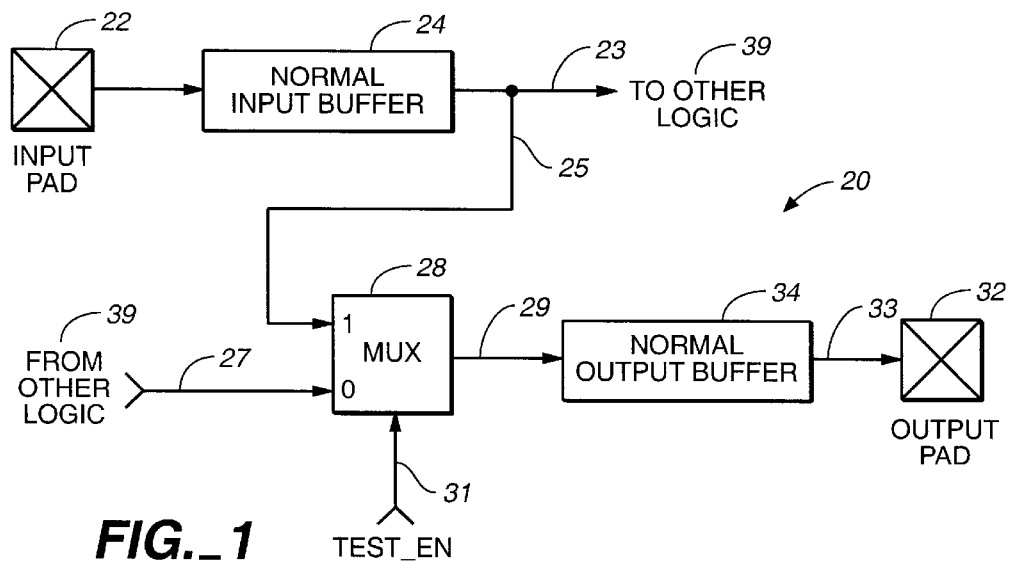
FIG._1
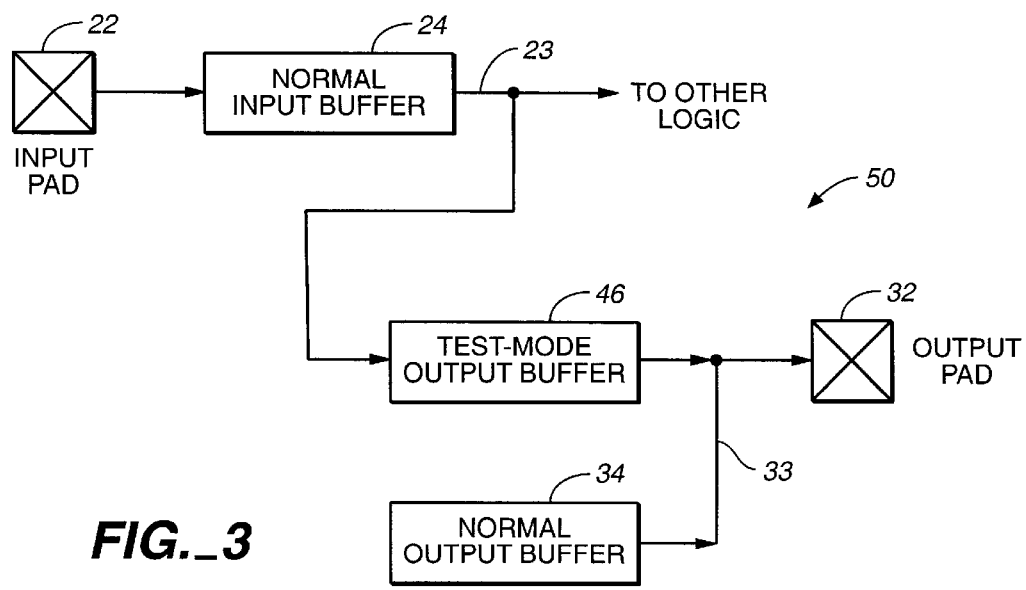
FIG._3

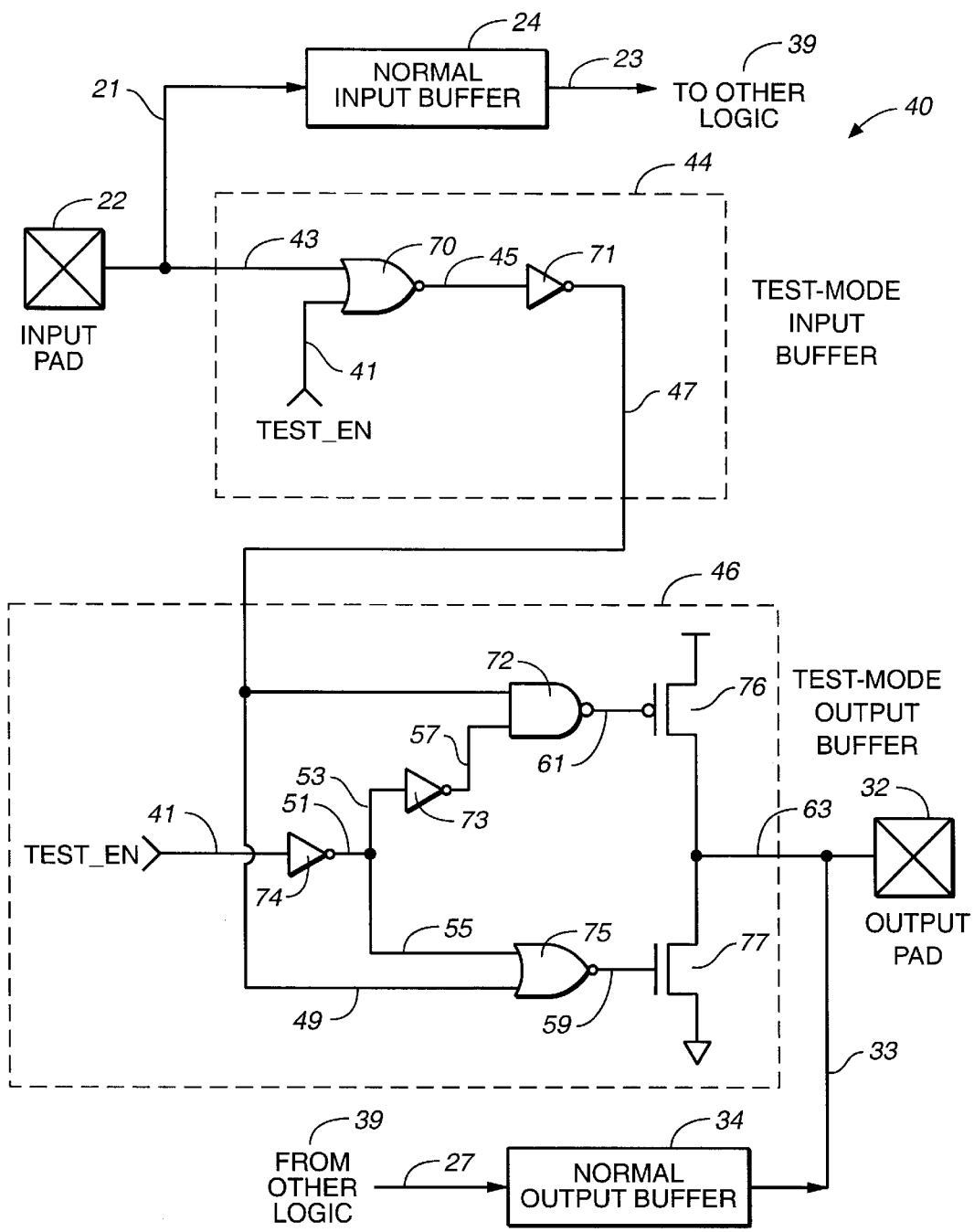
FIG._2

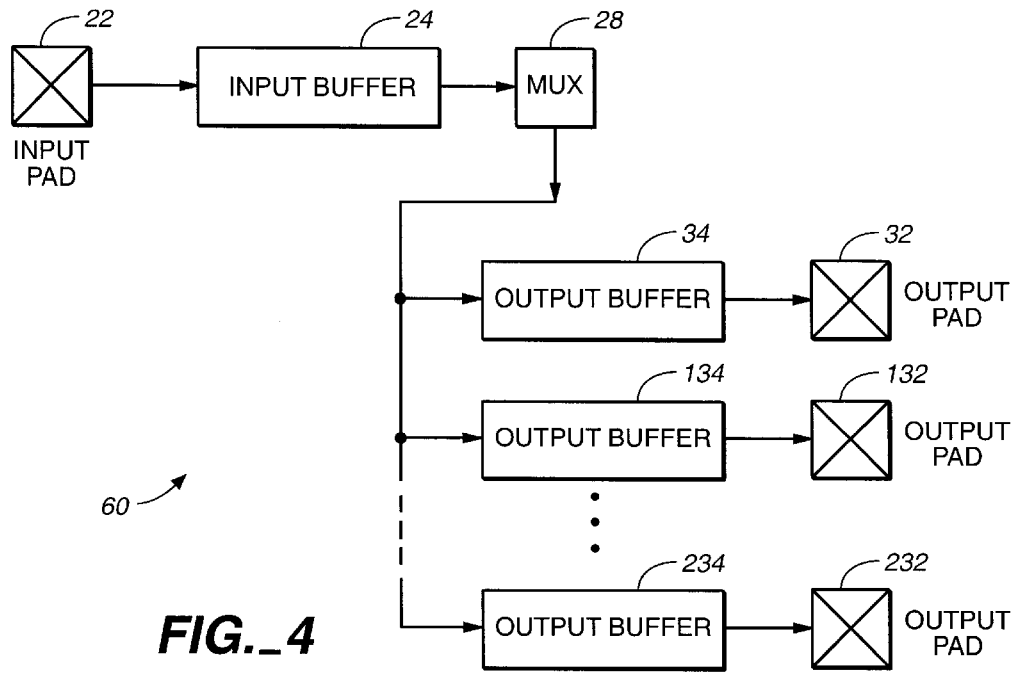
*FIG._4*
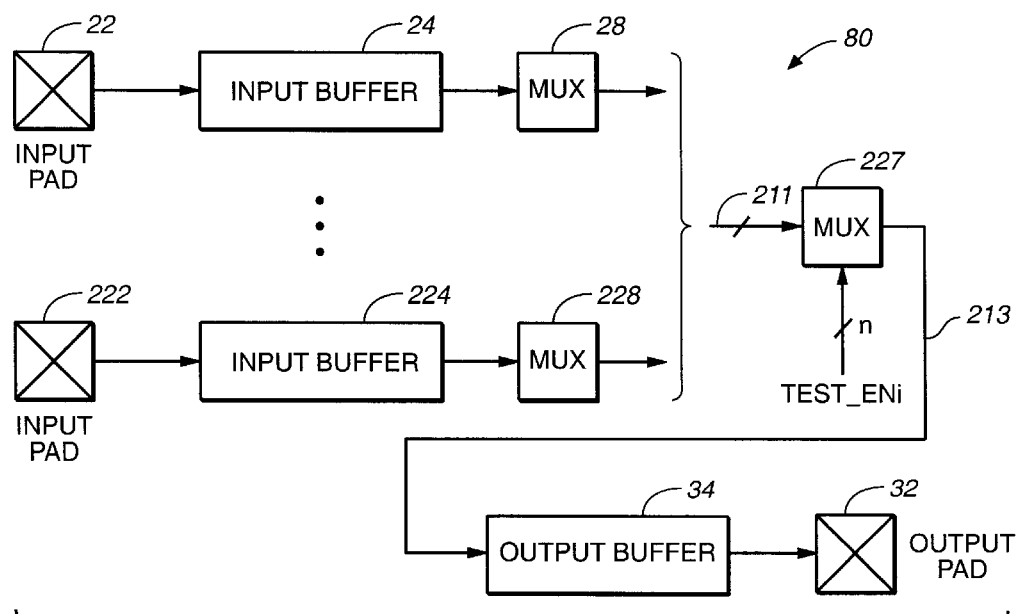
*FIG._5*

INPUT/OUTPUT CONTINUITY TEST MODE CIRCUIT

TECHNICAL FIELD

The present invention generally relates to semiconductor integrated circuit devices, and more particularly to a circuit within an integrated circuit device for testing the continuity of the input and output pins of the device.

BACKGROUND ART

In recent years, the density of semiconductor integrated circuit devices has increased substantially, both in regards to an increase in memory sizes and logic complexity and a decrease in device package sizes. This has resulted in integrated circuit devices having smaller pitches and higher lead counts. One resultant problem from this trend towards high density devices is that it is more difficult to ensure that all of the pins (input and output) of the device make solid contact in the socket or circuit board in which the device is to be programmed and tested. If the device pins are not making solid contact in the test socket or circuit board, then the subsequent testing and programming of the device could provide erroneous test results that might later lead to the failure of the device.

U.S. Pat. No. 5,983,377 to Knotts discloses a system and circuit for pin fault testing. The system includes an external tester and a circuit designed to be tested. The external tester is coupled to pins of the circuit and is configured to enter test data into the circuit. The external tester is also configured to receive continuity data from the circuit and to determine pin faults from a comparison of the test data to the continuity data. The circuit includes a plurality of scan cells which are coupled in a chain fashion. When testing input pins, the external tester places a test pattern onto the input pins, stores a continuity pattern into the scan cells that are electro-mechanically coupled to the input pins, serially scans the continuity pattern out of the circuit, and compares the continuity pattern to the test pattern. When testing the output pins, the external tester serially scans a test pattern into the scan cells coupled to the output pins and compares the continuity pattern generated on the output pins to the test pattern. It would be preferable to be able to test both the input and output pins at the same time. It would also be preferable to be able to optionally configure the IC device to be in a test mode as well as in its normal operating mode, without the need for specialized external test circuitry.

U.S. Pat. No. 4,825,414 to Kawata et al. discloses a semiconductor integrated circuit device having a normal mode and a test mode for testing internal memory blocks of the device. However, Kawata et al. does not discuss testing the continuity of the input and output pins of the device.

It is the object of the present invention to provide an integrated circuit device having an input/output continuity test mode circuit that can be used to ensure device-socket or device-board continuity for testing and programming.

SUMMARY OF THE INVENTION

The above object has been achieved by a continuity test mode circuit in an integrated circuit device having a means for switching between a continuity test mode and a normal operating mode, the test mode being characterized by one or more input pins being in direct electrical connection with one or more output pins to enable the pins of the chip package and chip socket or circuit board to be tested for continuity. In normal operating mode, the operation of the chip is not affected by the test mode circuitry.

In one embodiment of the invention, the normal input and output buffers are used with a multiplexer in between. The multiplexer connects the input buffer to the output buffer when the test mode is activated. Signals passing from an input pin through the input buffer will then pass straight through to the output buffer and an output pin. In normal mode, this direct connection is not made and the output buffer receives signals from the other parts of the device rather than directly from the input buffer.

In a second embodiment of the invention, additional input and output buffers, designated as test-mode buffers, are included in the circuit. These buffers are connected between the input and output pins, in parallel with the normal buffers, and are enabled only during the test mode.

The test mode circuit of the present invention allows all of the pins to be properly tested for solid contact in the programming socket or circuit board prior to initiating the programming cycle. Test signals can be placed on the input pins and then the signals generated on the output pins can be checked to determine whether proper contact has been made. The test mode circuit is included within the device, so no special external circuitry is needed to configure the device for testing. The test mode circuit can be activated on chip by way of a software command or similar means.

BRIEF DESCRIPTION OF THE DRAWINGS

FIG. 1 is a block diagram of a first embodiment of the test mode circuit of the present invention.

FIG. 2 is a circuit level block diagram of a second embodiment of the test mode circuit of the present invention.

FIGS. 3–5 are block diagrams of other alternate embodiments of the test mode circuit of the present invention.

BEST MODE FOR CARRYING OUT THE INVENTION

With reference to FIG. 1, a first embodiment of the test mode circuit of the present invention is shown. In the integrated circuit device, the input pins and output pins are connected to pads arranged on a surface of the device. In the circuit 20 of FIG. 1, there is at least one input pad 22 and at least one output pad 32. The input pads are connected to a normal input buffer 24, while the output pad 32 is connected to the output of the normal output buffer 34. A multiplexer 28 is connected between the normal input buffer 24 and the normal output buffer 34. The multiplexer 28 receives a first data input signal 25 from the output of the normal input buffer 24 and receives a second data input signal 27 from other logic within the integrated circuit device. The output 23 of the normal input buffer 24 can also proceed to other logic signals 39 within the integrated circuit device. The output 29 of the multiplexer 28 is connected to the input of the normal output buffer 34. A test enable signal 31 is implemented as a data select line for the multiplexer. The test enable signal 31 can be activated on chip by entering software commands, or by other equivalent means.

When the test enable signal is in a first state, the multiplexer 28 selects the data input 25 connected to the output of the normal input buffer 24. This provides a direct electrical connection between the normal input buffer 24 and the normal output buffer 34, and thus provides a direct electrical connection between the input pin 22 and the output pin 32. In this condition, the IC device would be operating in the continuity test mode. In the test mode of operation, signals can be placed on the input pin, allowing the signals at the output pins 32 to be evaluated to determine whether there is continuity of the pins with the device socket or circuit board. If the output signal 33 received on the pin is different than the expected output signal, then this would indicate that there may be a mechanical contact problem between the pins and the socket or circuit board.

When the test enable signal 31 is in a second state, the selected input of the multiplexer is the input 27 that received signals from the other logic circuit 39 in the IC device. The other data input 25 is not selected, so consequently the operation of the chip proceeds from the normal input buffer 24 to the other on-chip logic 39 and then back from the other logic 39 through the multiplexer 28 to the normal output buffer 34 and then to the output pin 32. In other words, the device operates in normal operating mode and there is no direct connection between the input pin 22 and the output pin 32.

With reference to FIG. 2, a second embodiment of the present invention is shown. The circuit 40 of this embodiment, includes a pair of designated test mode buffers, including a test mode input buffer 44 and a test mode output buffer 46. The test mode buffers 44, 46 are connected in parallel to the normal input buffer 24 and normal output buffer 34. As shown in FIG. 2, the normal input buffer 24 receives a signal 21 from the input pin 22 and the output of the buffer 23 is provided to other logic circuits 39 in the device. From the other logic circuit 39, the resultant signal 27 is input to the normal output buffer 34 and the output 33 of the output buffer 34 is provided on the output pin 32. Each of the test mode buffers 44 and 46 include a test enable signal 41 which is generated on chip by a software command or by other equivalent means. When the test enable signal 41 is in a first state, the test mode buffers 44, 46 are activated, providing a direct test connection between the input pin 22 and the output pin 32. When the test enable signal 41 is in a second state, the test mode buffers 44, 46 are deactivated and the integrated circuit device operates in normal operating mode.

Referring to the test mode buffers 44, 46, these buffers can be designed in a number of different ways. In the example shown in FIG. 2, the test mode output buffer is a tri-state buffer circuit. The input signal 43 enters the test mode input buffer as an input to a NOR gate 70. The second input to the NOR gate 70 is the test enable signal 41. The output 45 of the NOR gate 70 is inverted through an inverter 71, and the output 47 of the inverter 71 proceeds to the test mode output buffer 46. The output signal 47 of the test mode input buffer 44 is provided as a first input to a NAND gate 72. The test enable signal 41 is also supplied as an input to the test mode output buffer 46. A NOR gate 75 receives a first input 49 from the output 47 of the test mode input buffer 44 and received a second input 55 which is the test enable signal after being inverted by inverter 74. The inverted test enable signal 53 is inverted again through inverter 73 and the output 57 of the inverter is provided as an input to NAND gate 72. The output 61 of NAND gate 72 is provided to the gate of a P-channel FET 76, while the output 59 of the NOR gate 75 is provided to the gate of a N-channel FET 77. The output 63 of P-channel FET 76 and N-channel FET 77 is provided to the output pad 32.

Many variations of the test mode circuits shown in FIGS. 1 and 2 can be designed. With reference to FIG. 3, only one test mode output buffer 46 is implemented rather than using both a test mode input buffer and a test mode output buffer. In the embodiment of FIG. 3, the test mode output buffer 46 is parallel with the normal output buffer 34 and otherwise operates as is described above with reference to FIG. 2. FIG. 4 shows a case in which there are more output pins than input pins on the chip. In this case, some of the input pins can form pairs with more than one output pin. In the embodiment 60 of FIG. 4, there are a plurality of output buffers, 34, 134, 234 connected to a plurality of output pins 32, 132, 232. Optionally, a multiplexer 28 can be placed between the input buffer 24 and the plurality of output buffers in order to selectively test signals from an input pin to one of the connected output buffers. The circuit 80 of FIG. 5 shows a variation of the circuit 60 of FIG. 4, wherein there are a plurality of input pins connected together and supplied to a single output pin. In this case, the multiplexer 227 selects which signal passes from the input pins to the output buffer.

The above-described test mode circuits are exemplary and there are many ways to construct the test mode circuits claimed in the present invention. The main purpose of the test mode circuit is to provide a way to have the input pins and output pins formed in input/output pairs in order to test the continuity of the pins in the device socket or circuit board without affecting the normal operation of a chip.

What is claimed is:

1. In an integrated circuit device, a continuity test mode circuit comprising:
   at least one input pin and at least one output pin;
   a set of normal buffers, including an input buffer electrically coupled to the at least one input pin and an output buffer electrically coupled to the at least one output pin; and
   switching means between a test mode and a normal mode, said test mode being characterized by the least one input pin being directly connected through the normal buffers to the at least one output pin, said normal mode being characterized by the at least one input pin not being directly connected to the at least one output pin.

2. The circuit of claim 1, wherein the switching means is a multiplexer having a select input for receiving a test enable signal.

3. The circuit of claim 2, wherein the multiplexer has a first data input that is directly connected through the normal input buffer to the at least one input pin and a second data input that is not directly connected to the at least one input pin.

4. The circuit of claim 3, wherein the multiplexer has an output that is directly connected through the normal output buffer to the at least one output pin.

5. The circuit of claim 2, wherein the circuit is in the test mode when the test enable signal is in a first state and the circuit is in the normal mode when the test enable signal is in a second state.

6. The circuit of claim 5, wherein the first and second states of the test enable signal are determined by software command means.

7. The circuit of claim 1, further comprising:
   a set of test mode buffers connected in parallel with the normal buffers and including a test mode input buffer connected to the at least one input pin and a test mode output buffer connected to the at least one output pin, said test mode buffers each including a test enable pin for receiving a test enable signal.

8. The circuit of claim 7, wherein the circuit is in the test mode when the test enable signal is in a first state and the circuit is in the normal mode when the test enable signal is in a second state.

9. The circuit of claim 8, wherein the first and second states of the test enable signal are determined by software command means.

10. The circuit of claim 1, further comprising:

a test mode output buffer connected in parallel with the normal output buffer and being connected to the at least one output pin, said test mode output buffer including a test enable pin for receiving a test enable signal.

11. The circuit of claim 10, wherein the circuit is in the test mode when the test enable signal is in a first state and the circuit is in the normal mode when the test enable signal is in a second state.

12. The circuit of claim 1, further comprising:

a plurality of output pins;

a plurality of test mode output buffers, each connected in parallel with the normal output buffer and each being connected to a corresponding one of the plurality of output pins, said test mode output buffer including a test enable pin for receiving a test enable signal.

13. The circuit of claim 12, wherein the circuit is in the test mode when the test enable signal is in a first state and the circuit is in the normal mode when the test enable signal is in a second state.

14. The circuit of claim 1, further comprising:

a plurality of input buffers having outputs coupled to a set of data inputs of a multiplexer, said multiplexer having an output connected to the output buffer and having a select input for receiving a test enable signal.

15. The circuit of claim 14, wherein the circuit is in the test mode when the test enable signal is in a first state and the circuit is in the normal mode when the test enable signal is in a second state.

16. In an integrated circuit device, a continuity test mode circuit comprising:

at least one input pin and at least one output pin;

a set of normal buffers, including an input buffer electrically coupled to the at least one input pin and an output buffer electrically coupled to the at least one output pin;

a set of test mode buffers connected in parallel with the normal buffers and including a test mode input buffer connected to the at least one input pin and a test mode output buffer connected to the at least one output pin, said test mode buffers each including a test enable pin for receiving a test enable signal;

wherein the test mode buffers are enabled and make a direct connection between the at least one input pin and the at least one output pin when the test enable signal is in a first state; and wherein the test mode buffers are disabled when the test enable signal is in a second state.

17. The circuit of claim 16, wherein the test mode input buffer includes an input connected to the at least one input pin, an output connected to the test mode output buffer and a control line connected to the test enable pin.

18. The circuit of claim 16, wherein the test mode output buffer includes a tri-state buffer circuit having an input connected to the test mode input buffer, an output connected to at least one output pin, and a control line connected to the test enable pin.

19. The circuit of claim 16, wherein the at least one input pin is not directly connected to the at least one output pin when the test mode buffers are enabled.

20. The circuit of claim 16, wherein the normal buffers are disabled when the test mode buffers are enabled.

21. The circuit of claim 16, wherein the first and second states of the test enable signal are determined by software command means.

* * * * *